United States Patent
Czarnocki

[19]

[11] Patent Number: 5,869,998
[45] Date of Patent: Feb. 9, 1999

[54] AMPLIFIER CIRCUIT HAVING INDEPENDENT GAIN AND RESPONSE TIME ADJUSTMENTS

[75] Inventor: Walter Czarnocki, Hoffman Estates, Ill.

[73] Assignee: Motorola Inc., Schaumburg, Ill.

[21] Appl. No.: 763,575

[22] Filed: Dec. 10, 1996

[51] Int. Cl.⁶ .................................................. H03F 1/34
[52] U.S. Cl. ........................................ 330/107; 330/294
[58] Field of Search .............................. 330/86, 107, 109, 330/282, 294; 327/553, 558

[56] References Cited

U.S. PATENT DOCUMENTS 3,883,830  5/1975  Hekimian ........................... 330/109 X

OTHER PUBLICATIONS

Clarke, "Ring of Two BP Filter With Independent Adjustment", Electronic Engineering, vol. 52, No. 64, p. 19, Aug. 1980.

Primary Examiner—James B. Mullins
Attorney, Agent, or Firm—Nicholas C. Hopman

[57] ABSTRACT

An amplifier circuit (20) having independent gain and response time adjustments includes an amplifier (22), a response time resistor (30), a variable gain resistor (32) attached to the response time resistor and to an output of the amplifier (22), a response time capacitor (34) connected in parallel to the response time resistor (30), an anti-gain resistor (36) connected to a response time (30) and variable gain resistor (32) and to ground, and an input resistor (38) connected to the response time resistor (30) and to in input terminal of the amplifier (22). The response time resistor has a substantially greater resistance value than a resistance value of the variable gain resistor (32) for allowing a gain adjustment of the amplifier circuit (20) without changing the response time of the amplifier (22).

4 Claims, 1 Drawing Sheet

AMPLIFIER CIRCUIT HAVING INDEPENDENT GAIN AND RESPONSE TIME ADJUSTMENTS

FIELD OF THE INVENTION

This invention is generally directed to amplifier circuits, and specifically to amplifier circuits requiring gain and response time adjustments.

BACKGROUND OF THE INVENTION

In automotive systems, it is often desirable to measure a pressure difference between two locations. For example, it is necessary to measure a pressure difference across a sharp edge orifice in a EGR (exhaust gas reflow) system. To perform these measurements electronic sensors are used to produce an electrical output indicative of the measured pressure. Electronic sensors commonly include a pressure sensing element for converting the applied pressure into an electrical signal, and a signal conditioning circuit for receiving the signal from the pressure sensing element and amplifies, offsets, and temperature compensates the signal to produce a signal dependent on the measured pressure only. These adjustments are commonly referred to as calibration and temperature compensation.

The pressure sensing element is typically a silicon, piezoresistive, bulk micromachined element. The signal conditioning circuitry that is required is similar to that shown and described in patent application Ser. No. 08/717,465.

One of the requirements of an EGR sensor is a slow response time. This response time has to be slow ( in the 100s of milliseconds) because the sensed medium exhibits a significant amount of fast pressure fluctuations. These fluctuations do not contain any important information and can be viewed as noise.

In the EGR and similar applications only an average value of the pressure is of interest. Therefore, this average value needs to be separated from the noise. The noise can be eliminated by filtering with a low corner frequency or other similar method with a slow response time system. A problem encountered in these type systems is that the sensing elements, including the piezoresistive elements, and the amplifiers are relatively fast and much faster than the required response time. In addition, the amplifiers are typically much faster than electromechanical sensors. For instance, with a silicon, piezoresistive, bulk micromachined type pressure sensing element this response time may need to be as much as 200–300 times faster than required. Therefore, the sensing element's response time must be slowed down by some means such as electronically.

This slow down has typically been done by creating an averaging circuit, or an active low pass filter, as shown in FIG. 1. The circuit 10 has a capacitor 12 placed across a resistor 14 and an input resistor 16. Resistor 14 is the gain resistor and normally is the highest value resistor in circuit 10 since the gain is large and is determined by the resistor ratio of resistors 14 and 16. Connecting capacitor 12 across the large value resistor 14 makes the capacitive value of capacitor 12 the smallest. This type of design makes for a cost effective use of parts. This conventional approach works for circuits that do not need any gain trimming, which is not the case with pressure sensor circuits.

What is needed is a circuit that allows for such a cost effective design to be utilized, but also allows the gain to be adjusted as needed. This type of a gain adjustment is necessary in circuits such as signal conditioning circuits of pressure sensors because the gain adjustment is necessary for calibration of the variable sensitivity of the sensing elements.

BRIEF DESCRIPTION OF THE DRAWINGS

For a more complete understanding of the present invention reference should be made to the drawings, where.

DETAILED DESCRIPTION OF A PREFERRED EMBODIMENT

Figure 1:
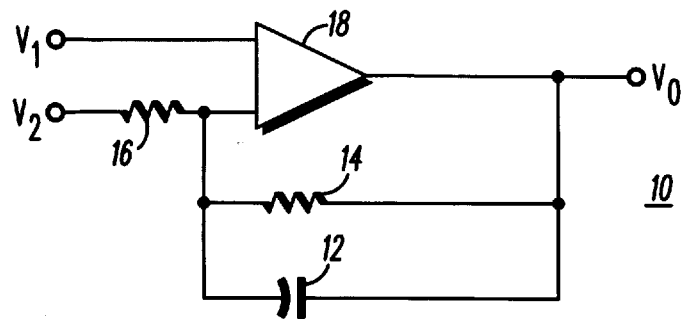
FIG. 1 is a prior art averaging circuit.

Present day manufacturing processes do not allow the manufacture of sensors with tight tolerances and thus, each sensor needs to be calibrated in order to achieve a necessary accuracy. Typically, the calibration involves adjustment of the gain and offset of the circuit, such as is done by circuit 10 in FIG. 1. The gain adjustment allows the circuit 10 to maintain the same output signal span or pressure sensitivity despite part-to-part variation of the sensing element's pressure sensitivity. Typically, this gain is trimmed using resistors in the feedback loop of operational amplifier (Op Amp) 18, in this case resistor 14. Conventionally, the gain is adjusted by trimming the feedback resistor 14. Increasing the value of resistor 14 will also increase the gain of circuit 10. When capacitor 12 is connected across the trimmed resistor 14, the response time will vary as the value of resistor 14 is changed.

As those skilled in the art will appreciate, this is not a desirable effect because the response time must be kept at a nominal value with a relatively small allowed tolerance around this nominal value. For example, the allowed tolerance may be ±10%, and the gain may need to be trimmed by a factor of 2 to eliminate the sensor's pressure sensitivity of ±50%. Thus, it is not feasible to accept this kind of solution because the gain adjustment is not independent of the response time adjustment.

Figure 2:
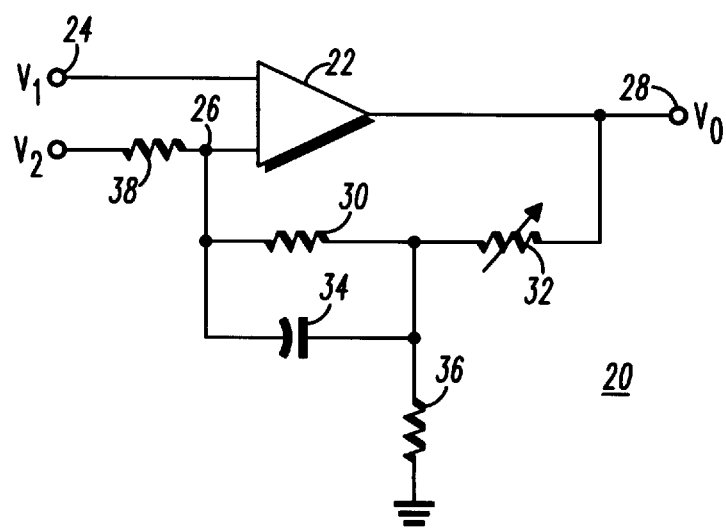
FIG. 2 is an amplifier circuit in accordance with the present invention.

The present invention uses a novel configuration, shown in FIG. 2, for a one stage amplifier circuit 20 to allow circuit 20 to have independent gain and response time adjustments. The amplifier circuit 20 has an amplifier 22 which presents input terminals 24 and 26, and an output terminal 28. The response time of amplifier 22 is typically much faster than required. A response time resistor 30 has a first lead coupled to input terminal 26 and a second lead coupled to a lead of variable gain resistor 32. The other lead of variable gain resistor 32 is connected to output terminal 28. The variable gain resistor 32 is used for adjusting the gain of circuit 20. A response time capacitor 34 is connected in parallel with the response time resistor 30. An anti-gain resistor 36 is connected to the second lead of response time resistor 30 and to ground. An input resistor 38 is connected to the first lead of response time resistor 30 and to input terminal 26. The response time resistor 30 has a substantially greater resistance value than the resistance value of variable gain resistor 32. In this particular configuration this feature allows the gain adjustment to be made without changing the response time of circuit 20. The large resistor value of response time resistor 30 is shunted by the capacitor 34. The larger the resistance value of response time resistor 30 is the smaller the capacitance value of capacitor 34. Keeping the capacitance value of capacitor 34 small allows for a more cost effective solution because of the relatively high cost of capacitors. Thus, this is a cost effective solution for achieving slower response times in a simple one stage amplifier circuit.

After choosing a resistance value for resistor 30 to give a desired response time, variable gain resistor 32 is trimmed to adjust circuit 20 gain. This configuration will not change the response time. To illustrate this effect, it is necessary to look at the equations that describe the output voltage of amplifier 22 at terminal 28. Assuming that response time resistor 30 is much greater than variable gain resistor 32, the AC (alternating current) value of the output voltage can be expressed as follows:

$$V_o \cong \left(1 + \frac{R32}{R36}\right)\left(\left(\frac{Z + R32}{R38}\right)(V_2 - V_1) + V_2\right) \quad \text{Equation 1}$$

where R32 is a resistance value of variable gain resistor 32, R36 is a resistance value of anti-gain resistor 36, R38 is a resistance value of input resistor 38, and $$Z = \frac{R30}{1 + s(C34)(R30)} \quad \text{Equation 2}$$

where Z is an impedance of the parallel connection of response time resistor 30, R30 is a resistance value of response time resistor 30, C34 is the capacitance value of response time capacitor 34, and s is a complex frequency.

If Equation 2 is substituted into Equation 1 and simplified for the $V_o/V_d$ transfer function where $V_d = V_2 - V_1$ then $$\frac{V_o}{V_d} \cong$$

$$\left(1 + \frac{R32}{R36}\right)\left(\frac{R30 + R32}{R38}\right)\left(\frac{1 + s(C34)(R32)}{1 + s(C34)(R30)}\right) \quad \text{Equation 3}$$

Thus, from Equation 3 the direct current (DC) gain is $$\left(1 + \frac{R32}{R36}\right)\left(\frac{R30 + R32}{R38}\right) \quad \text{Equation 4}$$

and the AC portion of the transfer function, which is responsible for the response time determination, with a pole, $f_p$, and a zero, $f_z$ is $$\left(\frac{1 + s(C34)(R32)}{1 + s(C34)(R30)}\right) \text{ where } f_p = \frac{1}{2\pi(C34)(R30)} \text{ and } \quad \text{Equation 5}$$

$$f_z = \frac{1}{2\pi(C34)(R32)}$$

Because response time resistor 30 has a substantially larger resistance value than variable gain resistor 32, $f_p$ is a dominate pole that produces the required response time. Whereas fz is a zero that is at a higher frequency and thus, any contribution to the response time in negligible. In typical sensor applications, the value of resistors 32 and 36 are an order of magnitude or more smaller than the resistance value of resistor 30.

In the equations above, it can be seen that if the gain is adjusted by trimming resistor 32 the pole, $f_p$, will not be affected. As those skilled in the art will appreciate $f_p$ is the primary factor in the response time of circuit 20. The zero, $f_z$, will change slightly but because the zero is at a much higher frequency its contribution to response time change will be negligible.

Thus, there has been shown and described a specific embodiment of the invention, further modifications and improvements will occur to those skilled in the art. All modifications retaining the basic underlying principles disclosed and claimed here in are within the scope of this invention.

What is claimed is:

1. An amplifier circuit having independent gain and response time adjustments comprising:

an amplifier presenting a plurality of input terminals and an output terminal;

a response time resistor having first and second leads wherein the first lead is coupled to one of the input terminals;

a variable gain resistor coupled to the second lead and to the output terminal for adjusting a gain of the amplifier;

a response time capacitor connected in parallel with the response time resistor;

an anti-gain resistor connected to the second lead and to a ground;

an input resistor connected to the first lead and to one of the input terminals; and wherein the response time resistor has a substantially larger resistance value than a resistance value of the variable gain resistor for allowing a gain adjustment of the amplifier circuit without changing a response time of the amplifier circuit.

2. The circuit of claim 1 wherein the amplifier is an operational amplifier.

3. The circuit of claim 1 wherein the response time resistor resistance value is an order of magnitude larger than the variable gain resistor resistance value.

4. An amplifier circuit having independent gain and response time adjustments comprising:

an amplifier for amplying an input signal, the amplifier presenting a plurality of input terminals and an output terminal;

a response time resistor for controlling a response time of the amplifier and having first and second leads wherein the first lead is coupled to one of the terminals wherein the response time resistor has a resistance value for controlling the repsonse time of the amplifier circuit;

a response time capacitor connected in parallel with the response time resistor;

a variable gain resistor coupled to the second lead and to the output terminal for adjusting the gain of the amplifier circuit wherein a resistance value of the gain resistor controls the gain;

an anti-gain resistor connected to the second lead and to a ground;

an input resistor connected to the first lead and to one of the input terminals; and wherein the response time resistor and the response time capacitor form a response time circuit for determining a response time of the amplifier circuit for determining a response time of the substantially larger than any resistance value of the variable gain resistor such that variation gain resistor resistance value will not effect the response time of the amplifier circuit.

* * * * *